(12) United States Patent
Liu et al.

(10) Patent No.: US 6,436,839 B1
(45) Date of Patent: Aug. 20, 2002

(54) INCREASING PROGRAMMING SILICIDE PROCESS WINDOW BY FORMING NATIVE OXIDE FILM ON AMOURPHOUS SI AFTER METAL ETCHING

(75) Inventors: Chi-Kang Liu, Tao-yan County; Hsiu-Hsiang Lin; Kang-Hei Chang, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/323,453

(22) Filed: Jun. 1, 1999

(51) Int. Cl.$^7$ .............................................. H01L 21/302
(52) U.S. Cl. ...................... 438/719; 438/720; 438/753; 438/754
(58) Field of Search ................................. 438/719, 720, 438/753, 754

(56) References Cited

U.S. PATENT DOCUMENTS

| | | | | |
|---|---|---|---|---|
| 4,671,970 A | * | 6/1987 | Keiser et al. ................. | 427/93 |
| 5,376,235 A | * | 12/1994 | Langley ..................... | 156/664 |
| 5,578,163 A | * | 11/1996 | Yachi ........................ | 156/643.1 |
| 5,668,411 A | * | 9/1997 | Hong et al. ................. | 257/751 |
| 5,730,834 A | * | 3/1998 | Gabriel ..................... | 156/643.1 |
| 5,736,458 A | | 4/1998 | Teng ........................ | 438/627 |
| 5,738,458 A | * | 4/1998 | Teng ........................ | 438/627 |
| 5,763,299 A | * | 6/1998 | McCollum et al. ......... | 438/131 |
| 5,804,500 A | * | 9/1998 | Hawley et al. ............. | 435/600 |
| 5,923,948 A | * | 7/1999 | Cathey, Jr. ................. | 438/20 |

* cited by examiner

Primary Examiner—Benjamin L. Utech
Assistant Examiner—Charlotte A. Brown
(74) Attorney, Agent, or Firm—George O. Saile; Stephen B Ackerman

(57) ABSTRACT

A method of forming a misalignment immune antifuse is presented comprised of the following steps. A partially processed semiconductor wafer is provided, containing at least one device electrically connected to a conducting region extending almost to the wafer surface, where the conducting region is surrounded by a dielectric layer which reaches the wafer surface. A blanket layer of amorphous silicon is deposited followed by deposition of a thin blanket layer of TiN and these layers are etched down to the dielectric surface except for that above the conducting region and some of the surrounding dielectric. A thin native oxide is formed over the exposed surface of the amorphous silicon. This is followed by deposition of a thicker TIN layer and of a metallization layer, which are patterned and etched so that contact is made to the lower layers. The oxidation step is repeated so as to oxidize any amorphous silicon surface that may have been inadvertently exposed in the last etching step.

24 Claims, 4 Drawing Sheets

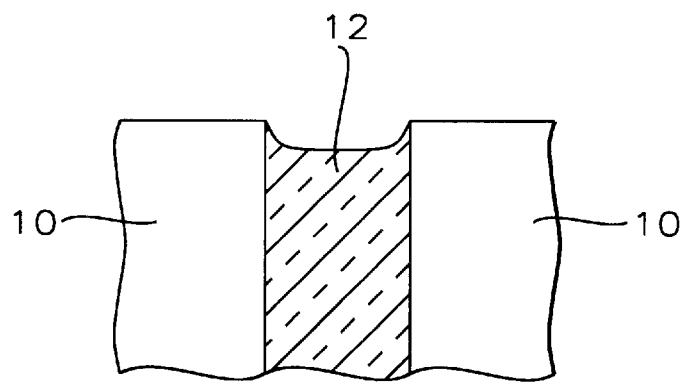
*FIG. 1 - Prior Art*
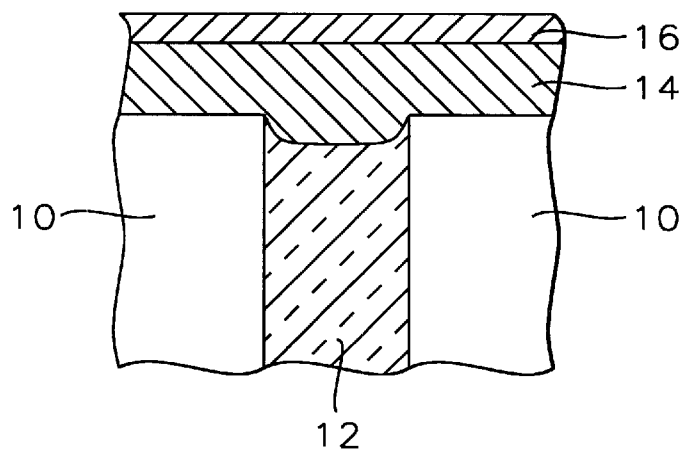
*FIG. 2 - Prior Art*
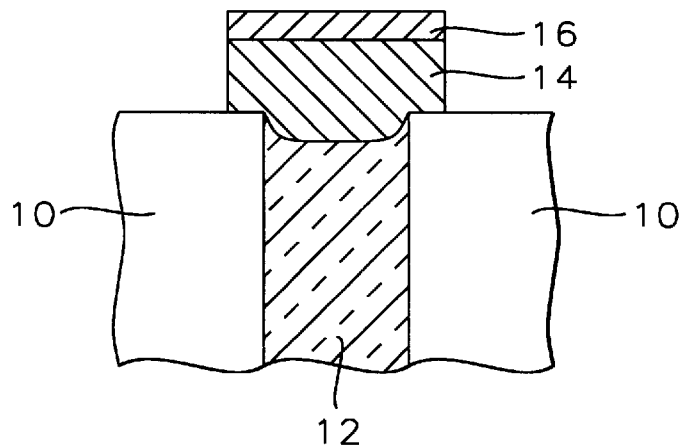
*FIG. 3 - Prior Art*

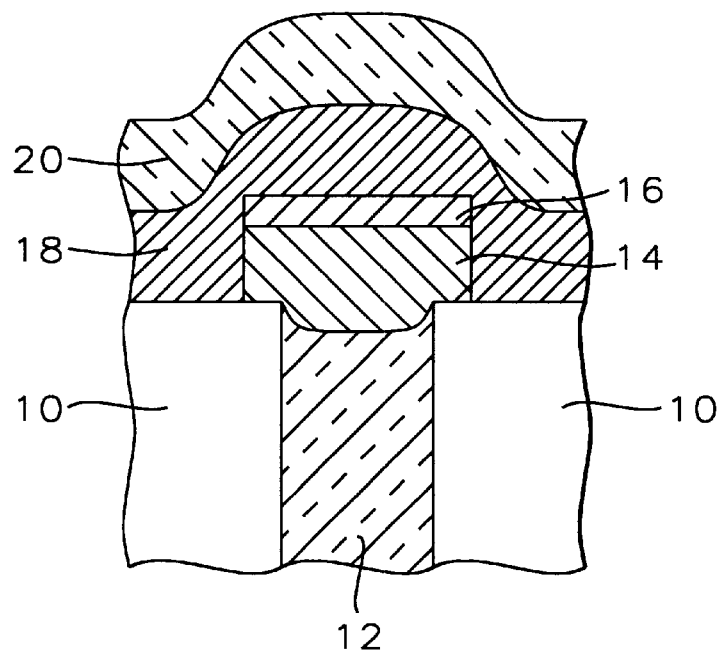
FIG. 4 - Prior Art
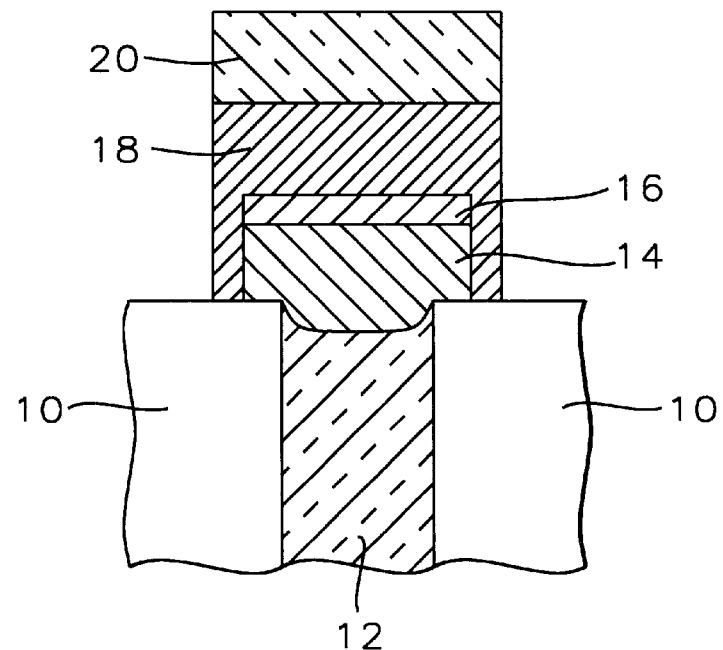
FIG. 5 - Prior Art

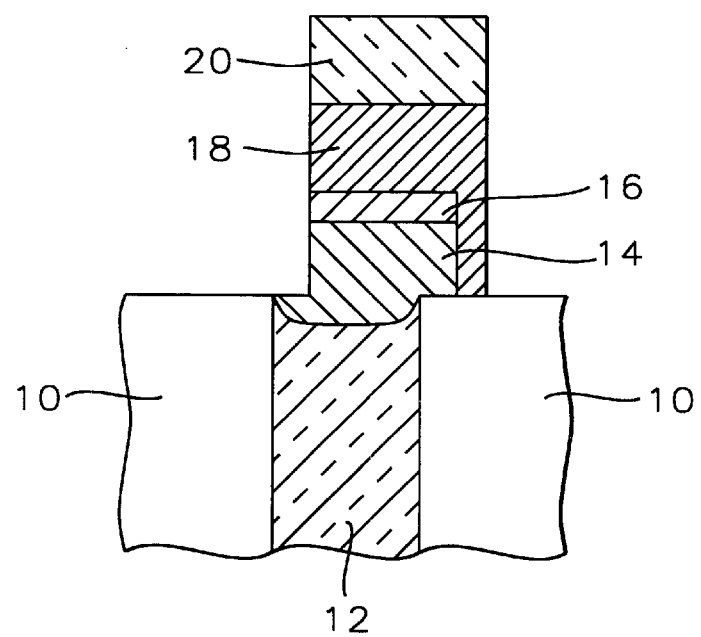
FIG. 6 - Prior Art
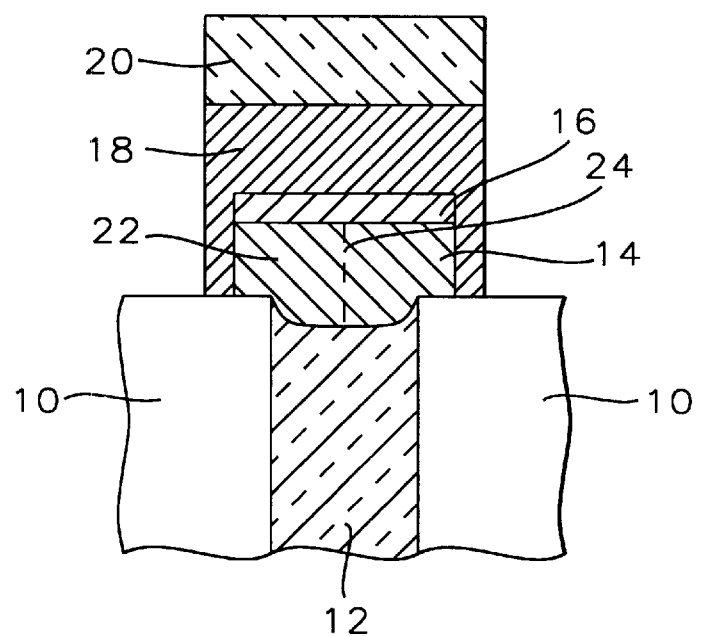
FIG. 7 - Prior Art

INCREASING PROGRAMMING SILICIDE PROCESS WINDOW BY FORMING NATIVE OXIDE FILM ON AMOURPHOUS SI AFTER METAL ETCHING

BACKGROUND OF THE INVENTION

(1) FIELD OF THE INVENTION

The present invention relates to the fabrication of semiconductor integrated circuits, and more particularly to the use of processing steps to improve the yield of semiconductor integrating circuits.

(2) DESCRIPTION OF PRIOR ART

Processing steps designed specifically to improve the manufacturing yield in semiconductor integrated circuits are used extensively. In U.S. Pat. No. 5,376,235 to Langley, a method to eliminate corrosion in conductive elements is disclosed wherein a wash in a dilute phosphoric acid, performed after metal etch, removes corrosive contaminants. A method to remove residual materials in the manufacture of semiconductor devices is shown in U.S. Pat. No. 5,578,163 to Yachi, where ashing and wet washing processes are used to achieve the removal. U.S. Pat. No. 5,668,411 to Hong et. al. shows a diffusion barrier trilayer that minimizes the reaction of a metallization layer with underlying barrier layers of integrated circuits, thus maintaining the sheet resistance of the metallization layer. Rinsing with water after tungsten etchback, but before exposure to oxygen, improves the connection between tungsten plugs and metallization layers, according to U.S. Pat. No. 5,730,834 to Gabriel. A method for improving the electrical resistance of contacting surfaces in via holes is disclosed in U.S. Pat. No. 5,736,458 to Teng, where it is shown that a N2 treatment, preferably followed by a vacuum break, results in reduced contact resistance.

The present invention relates to so-called antifuse devices. An antifuse is placed in series with a device, such as a transistor, when that device is required to be open circuited until, possibly, some future time. As inserted an antifuse acts as an insulating element, blocking current flow. When it is desired to activate the devise in series with the antifuse, a stress is applied, which causes the antifuse to become conducting and, thus, the device to become operational.

An antifuse particularly relevant to this invention is described with the aid of FIGS. 1–5 Prior Art, which depict a conventional process flow for this device. In FIG. 1 Prior Art is shown a metal plug, 12, through a layer of dielectric, 10. The material of the plug is often tungsten, although other metallic substances can be used, and the purpose of the plug is to provide electrical connection to conducting regions disposed under the plug and dielectric layer. As shown in FIG. 2 Prior Art, a blanket layer of amorphous silicon, 14, about 700 angstroms thick, is deposited followed by the blanket deposition of about 250 angstroms of TiN, 16. An etching step follows in which the amorphous silicon and TiN are removed except in a region over the metal plug and a segment of the dielectric layer adjacent to the plug, as depicted in FIG. 3 Prior Art. There follows blanket depositions of about 1000 angstroms of TiN, 18, and about 8000 angstroms of aluminum copper, 20 or an appropriate thickness of other metallization. This is depicted in FIG. 4 Prior Art. The final step is to etch these layers except in a region overlapping the amorphous silicon and TiN layer previously etched, resulting in the structure shown in FIG. 5 Prior Art.

If only potentials less then about 8 volts are applied across these layers the amorphous silicon should behave as an insulator with a very high resistance. With a voltage stress larger than about 8 volts a transition should occur and the resistance becomes and stays low. It is believed that under the influence of a sufficiently high electric field, titanium from the TiN reacts with the amorphous silicon to form titanium silicide, which is a conductor. The potential required to attain the lowest field capable of forming silicide is termed the programming voltage and the resulting silicide is called the programming silicide. The programming voltage generally depends on the materials and geometry of the device; a programming voltage of eight volts being appropriate for the typical case described and depicted in the figures. For successful operation of the antifuse it is important that the programming voltage not vary appreciably from its design value.

A source of variation of the programming voltage from its intended value is found to be photo misalignment, which could occur when defining the patterns to be etched. Structures that are sometimes observed, resulting from photo misalignment, are similar to that shown in FIG. 6 Prior Art. Programming voltages for such structures are found to be about 5 volts, which is likely to be unacceptable. Apparently, the electric field induced phenomena responsible for the transition of the amorphous silicon from insulating to conducting behavior acts more efficiently at the bare, and possibly contaminated, surface than in the bulk of the amorphous silicon. For an aligned device the bare surface of the amorphous silicon is situated away from the tungsten plug. Therefor, during voltage application, the surface field for an aligned device is smaller than the field in the bulk of the amorphous silicon that is over the tungsten plug. As a result the phenomena leading to the conducting state takes place in the bulk of the amorphous silicon, even though the susceptibility is greater at the surface. However, the surface field is larger the closer the surface is to the tungsten plug. At some distance the susceptibility advantage at the surface evens out the field advantage of the bulk and at closer distances the transition to the conducting state occurs at the surface and with a minimum applied potential, or programming voltage, lower than when the transition occurs in the bulk. Therefor, when voltage is applied across an antifuse that is misaligned as in FIG. 6 Prior Art, with the amorphous silicon surface being over the tungsten plug the electric field along the surface is comparable to that in the bulk of the amorphous silicon. In this situation the programming voltage should be near its lowest value. A value of about 5 volts is observed which is appreciably lower than the programming voltage of about 8 volts observed for an aligned antifuse.

In terms of the proposed mechanism, in which the transition to a conducting state occurs because titanium silicide forms in the amorphous silicon, the increased susceptibility can be understood because atoms can usually move much easier along a bare surface than in the bulk. This is especially the case if the surface is contaminated, as is possible to occur during processing. An enhanced reaction rate is than expected for the production of programming silicide and therefor a decreased programming voltage. A reduced programming voltage can lead to devices being activated unintentionally, and thereby causing errors. A possible solution is to increase the size of the amorphous silicon layer, and also the TiN and aluminum copper layers, relative to that of the tungsten plug. The increase should be large enough, so that even with the most severe misalignment that needs to be considered, the silicon surface is sufficiently separated from the tungsten plug so that no reduction in programming voltage takes place. However, such a solution involves an increase in the area required for the antifuse, which is clearly undesirable. Therefor, an alternative method to eliminate the occurrence of reduced programming voltage is required and is supplied by this invention.

Another configuration of the antifuse, also due to misalignment, that could lead to a reduced programming voltage is shown in FIG. 7 Prior Art. The cause of failure in this case is an increased electric field. As shown in FIG. 7 Prior Art, the bottom of the amorphous silicon sidewall is situated closer to the tungsten plug than the upper surface of the amorphous silicon, and the TiN is contacting the sidewall. The magnitude of the electric field along a field line from a lower point of the sidewall to the plug, 22, could, for this configuration, be substantially greater than the field along a field line from the top amorphous silicon surface to the plug, 24. In this case, the programming voltage would be decreased to the voltage at which the average field along a field line like 22 is equal to the average field along a field line like 24, for an aligned antifuse at the programming voltage.

SUMMARY OF THE INVENTION

Accordingly, it is a primary objective of the invention to provide a method for fabricating an antifuse that could retain its programming voltage even for quite severe misalignments. The invention provides a technique to sufficiently reduce the susceptibility of the amorphous silicon surface so that transitions to a conducting state will not occur there at voltages less than the programming voltage appropriate for the bulk of the amorphous silicon. In addition, the technique serves to prevent low voltage transitions to a conducting state caused by enhanced fields resulting from misalignment. Therefor, misalignments do not, essentially, lead to failure in antifuses fabricated according to the invention, thus increasing the antifuse process window.

In accordance with the objectives of the invention a misalignment tolerant antifuse is achieved by forming native oxide on exposed amorphous silicon surfaces, after, both, the amorphous silicon and metal etching steps. This serves to decrease the transition susceptibility at the surface to a value probably lower than that for bulk amorphous silicon and also to block the transition at regions of high electric field resulting from misalignment.

Therefor, methods of forming an antifuse according to this invention incorporate oxidation of the exposed amorphous silicon surface. A partially processed semiconductor wafer is provided, containing at least one device electrically connected to a conducting region extending almost to the wafer surface, where the conducting region is surrounded by a dielectric layer which reaches the wafer surface. A blanket layer of amorphous silicon is deposited followed by deposition of a thin blanket layer of TiN and these layers are etched down to the dielectric surface except for that above the conducting region and some of the surrounding dielectric. A thin native oxide is formed over the exposed surface of the amorphous silicon. This is followed by deposition of a thicker TIN layer and of a metallization layer, which are patterned and etched so that contact is made to the lower layers. The oxidation step is repeated so as to oxidize any amorphous silicon surface that may have been inadvertently exposed in the last etching step.

BRIEF DESCRIPTION OF THE DRAWINGS

In the accompanying drawings, forming a material part of this description, there is shown:

FIGS. 1 to 5 Prior Art showing the conventional antifuse process flow.

FIGS. 6 and 7 show misaligned antifuses.

DESCRIPTION OF THE PREFERRED EMBODIMENTS

Figure 8:
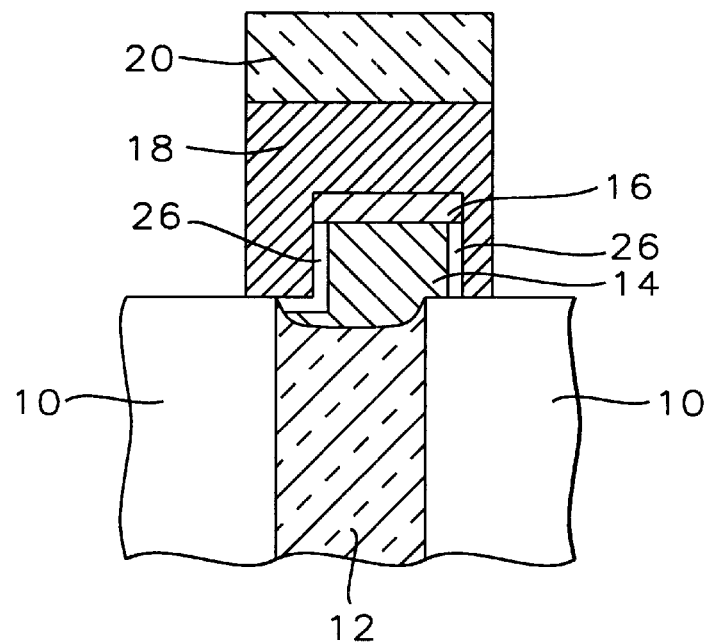
FIGS. 8 and 9 show misalignment in antifuses fabricated according to the present invention.

Referring to FIG. 1 Prior Art there is shown a partially processed semiconductor wafer. A tungsten plug, 12, through a dielectric, layer, 10, electrically connects to a device within the semiconductor wafer. As shown, the surface of the dielectric layer should preferably be higher than that of the tungsten. A layer of about 630 to 770 angstroms amorphous silicon, 14 in FIG. 2 Prior Art, is blanket deposited followed by blanket deposition of about 225 to 250 angstroms TiN, layer 16. This thin TiN layer is deposited at this stage to protect the top surface of the amorphous silicon from oxidation and contamination during subsequent processing.

Next, layers 14 and 16 are patterned and etched to form a cap like structure, as depicted in FIG. 3 Prior Art. The width of layers 14 and 16, after etching, should be greater than that of the tungsten plug. One reason for this is that as a consequence even with misalignment layers 14 and 16.may still cover the tungsten plug. Another reason is that, in the conventional antifuse, TiN covers the amorphous silicon sidewall. It is important that the shortest distance between TiN and tungsten is not much shorter than the width of the tungsten layer. Otherwise the programming voltage will be reduced, because there will exist electric fields appreciably greater than the voltage difference across the amorphous silicon layer divided by the layer thickness, which is the expected field. By making layers 14 and 16 sufficiently wide this problem can be avoided even for antifuses with limited misalignment.

However, sufficiently large misalignments will always give rise to configurations where increased fields or increased susceptibility will result in decreased programming voltages, Making layers 14 and 16 so wide that misalignments large enough to cause failure are highly improbable is inefficient, since it uses costly wafer real estate. In any case, the best solution is to prevent failures even for severely misaligned antifuses. This is accomplished according to the invention in the next process step, and also after the next etching step, by oxidizing any exposed amorphous silicon surface.

At this stage, the exposed amorphous silicon surface usually comprises just the sidewall; however, for a sufficiently large misalignment an area above the tungsten plug is also exposed. These surfaces, after oxidation, are indicated as region 26 in FIG. 8, which depicts a misaligned antifuse processed according to the invention. Failures that would normally have occurred at high field regions, in the conventional antifuse, are blocked, in the antifuse processed according to the invention, by the oxide introduced. Since this blocking action is accomplished by altering the properties of an interface or of a surface, quite a thin oxide is sufficient.

In a most preferred embodiment of the invention the oxidation step is performed in the stripper chamber used to strip the masking photoresist. This chamber is maintained at about 225 to 275 degrees Celsius. The oxidation is a three-step process so it can coincide with the photoresist stripping. In the first step the RF power is off and a humid oxygen atmosphere is maintained for 10 second; by a gas flow of 3000 sccrn O2 and 500 sccm H2O. The RF power is on in step 2, which has a gas flow of 500 sccm H2O for 20 seconds. Step 3 is performed with RF power on, for 30 seconds with the same gas flow as step 1.

Other methods of oxidizing the exposed amorphous silicon surface, such as dipping in DI water or exposure to wet or dry oxygen at other temperatures and duration, are also embodiments of the invention. The most preferred embodiment described above is especially efficient and economical.

The next step in the process flow is blanket deposition of 900 to 1100 angstroms TiN followed by blanket deposition of about 7200 to 8900 angstrorns of aluminum copper, layers 18 and 20, respectively. An appropriate thickness of other metallurgy can be used instead of aluminum copper. The structure at this point in the conventional processing flow is depicted in FIG. 4 Prior Art. In the processing flow of the invention the difference is only that the amorphous silicon sidewall is oxidized and, for sufficiently severe misalignments, also some area above the tungsten plug.

Patterning and etching layers 18 and 20 would complete the conventional process flow, providing a structure depicted in FIG. 5 Prior Art, for an aligned conventional antifuse and also such as depicted in FIGS. 6 and 7 Prior Art, examples of misaligned conventional antifuses, In the process flow according to the invention, the oxidation step formed oxide at least over the amorphous silicon sidewall and, with sufficient misalignment, on an additional area over the tungsten plug. The structure is shown in FIG. 8 for a misalignment sufficient for oxidation of the additional area, with small enough misalignments only the amorphous silicon sidewall would be oxidized. A situation exists where the last etch step could expose new amorphous silicon surface. If the edge of the etch mask for layers 18 and 20 falls over the etched layers 14 and 16, then the second etch step will etch a portion of layers 16 and 18 as well as the intended layers 18 and 20. Thus a portion of the amorphous silicon sidewall will be exposed. If in addition the mask edge is over the tungsten plug, the exposed surface will not experience a diminished field. Since the susceptibility for transition to the conducting state is larger at an exposed surface, a lowered programming voltage will be found.

Figure 9:
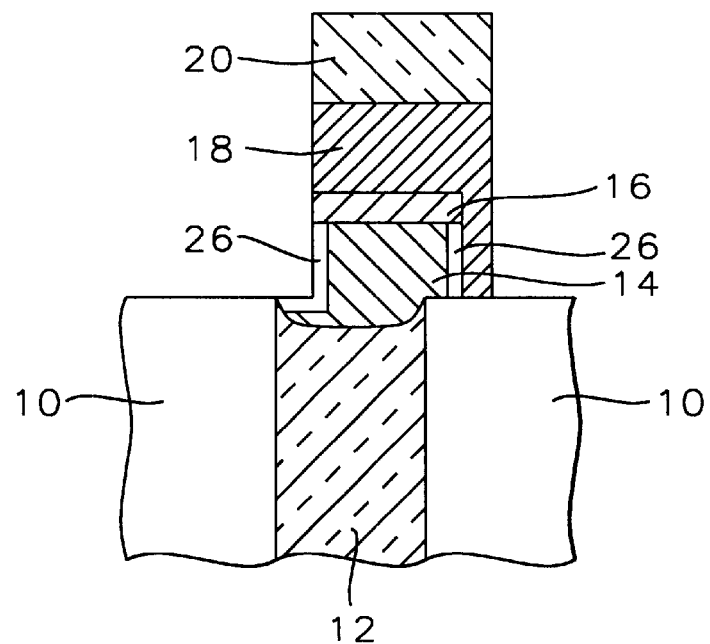

Repeating the oxidation step at this point will reduce the susceptibility at the amorphous silicon surface that was exposed in the second etch step so that the programming voltage will not be reduced. The structure after oxidation is shown in FIG. 9. In a most preferred embodiment of the invention the second oxidation step is a repeat of the previous three step procedure carried out at 250 degrees Celsius in the stripper chamber, where the masking photoresist is removed. Other oxidizing procedures would also serve the requirements of the invention.

While the invention has been particularly shown and described with reference to the preferred embodiments thereof, it will be understood by those skilled in the art that various changes in form and detail may be made without departing from the spirit and scope of the invention.

What is claimed is:

1. A method of forming a misalignment immune antifuse, such that a programing voltage is not degraded upon misalignment, comprising:

providing a partially processed semiconductor wafer containing at least one device electrically connected to a conducting region extending almost to the wafer surface, where said conducting region is surrounded by a dielectric layer which reaches the wafer surface;

depositing a blanket layer of amorphous silicon followed by depositing a thin blanket layer of TiN;

patterning and etching said layers down to said dielectric surface except for a cap that more than covers said conducting region;

growing a thin oxide over the exposed surface of said amorphous silicon:

depositing a thicker blanket TIN layer and of a blanket metallization layer;

patterning and etching said thick TiN and metallization layer down to said dielectric layer except for a cap that more than covers said thin TiN and amorphous silicon layers;

growing a thin oxide over any said amorphous silicon surface that may have been exposed in said last etching step, whereby a misalignment immune antifuse, such that the programming voltage is not degraded upon misalignment, is formed.

2. The method of claim 1 wherein said conducting region is a tungsten plug.

3. The method of claim 1 wherein said conducting region is an aluminum plug.

4. The method of claim 1 wherein said conducting region is a copper plug.

5. The method of claim 1 wherein said conducting region is a silicide plug.

6. The method of claim 1 wherein said metallization is comprised of aluminum copper.

7. The method of claim 1 wherein said metallization is comprised of tungsten.

8. The method of claim 1 wherein said metallization is comprised of polysilicon.

9. A method of forming a misalignment immune antifuse, such that a programming voltage is not degraded upon misalignment, comprising:

providing a partially processed semiconductor wafer containing at least one device electrically connected to a conducting region extending almost to the wafer surface, where said conducting region is surrounded by a dielectric layer which reaches the wafer surface;

depositing a blanket layer of amorphous silicon followed by depositing a thin blanket layer of TiN;

patterning and etching said layers down to said dielectric surface except for a cap that more than covers said conducting region;

growing an oxide over the exposed surface of said amorphous silicon by flowing O2 and H2O vapors in the stripping charmer of a semiconductor wafer processing apparatus, at temperatures and conditions appropriate for photoresist stripping;

depositing a thicker blanket TIN layer and of a blanket metallization layer;

patterning and etching said thick TiN and metallization layer down to said dielectric layer except for a cap that more than covers said thin TiN and amorphous silicon layers;

growing an oxide over any said amorphous silicon surface that may have been exposed in said last etching step by flowing O2 and H2O vapors in the stripping chamber of a semiconductor wafer processing apparatus, at temperatures and conditions appropriate for photoresist stripping, whereby a misalignment immune antifuse, such that the programming voltage is not degraded upon misalignment, is formed.

10. The method of claim 9 wherein said conducting region is a tungsten plug.

11. The method of claim 9 wherein said conducting region is an aluminum plug.

12. The method of claim 9 wherein said conducting region is a copper plug.

13. The method of claim 9 wherein said conducting region is a silicide plug.

14. The method of claim 9 wherein said metallization is comprised of aluminum copper.

15. The method of claim 9 wherein said metallization is comprised of tungsten.

16. The method of claim 9 wherein said metallization is comprised of polysilicon.

17. A method of forming a misalignment immune antifuse, such that a programming voltage is not degraded upon misalignment, comprising:

provinding a partially processed semiconductor wafer containing at least one device electrically connected to a conducting region extending almost to the wafer surface, where said conducting region is surrounded by a dielectric layer which reaches the wafer surface;

depositing a blanket layer of amorphous silicon followed by depositing a thin blanket layer of TiN;

patterning and etching said layers down to said dielectric surface except for a cap that more than covers said conducting region;

growing an oxide over the exposed surface of said amorphous silicon by dipping in DI water;

depositing a thicker blanket TiN layer and of a blanket metallization layer;

patterning and etching said thick TiN and metallization layer down to said dielectric layer except for a cap that more than covers said thin TiN and amorphous silicon layers;

growing an oxide over any said amorphous silicon surface that may have been exposed in said last etching step by dipping in DI water, whereby a misalignment immune antifuse, such that the programming voltage is not degraded upon misalignment, is formed.

18. The method of claim 17 wherein said conducting region is a tungsten plug.

19. The method of claim 17 wherein said conducting region is an aluminum plug.

20. The method of claim 17 wherein said conducting region is a copper plug.

21. The method of claim 17 wherein said conducting region is a silicide plug.

22. The method of claim 17 wherein said metallization is comprised of aluminum copper.

23. The method of claim 17 wherein said metallization is comprised of tungsten.

24. The method of claim 17 wherein said metallization is comprised of polysilicon.

* * * * *